(12) United States Patent
Tan et al.

(10) Patent No.: US 9,985,051 B2
(45) Date of Patent: May 29, 2018

(54) DISPLAY PANEL, FABRICATION METHOD THEREOF AND DISPLAY APPARATUS

(71) Applicant: BOE TECHNOLOGY GROUP CO., LTD., Beijing (CN)

(72) Inventors: Jifeng Tan, Beijing (CN); Yafeng Yang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days. days.

(21) Appl. No.: 15/651,218

(22) Filed: Jul. 17, 2017

(65) Prior Publication Data

US 2018/0019265 A1    Jan. 18, 2018

(30) Foreign Application Priority Data

Jul. 18, 2016  (CN) .......................... 2016 1 0566557

(51) Int. Cl.
| | |
|---|---|
| *F21V 8/00* | (2006.01) |
| *H01L 27/12* | (2006.01) |
| *H01L 27/32* | (2006.01) |
| *H01L 51/52* | (2006.01) |
| *H01L 27/146* | (2006.01) |
| *H01L 27/02* | (2006.01) |

(52) U.S. Cl.
CPC ...... *H01L 27/1214* (2013.01); *H01L 27/3211* (2013.01); *H01L 51/5284* (2013.01); *G02F 2201/305* (2013.01); *H01L 27/0214* (2013.01); *H01L 27/14692* (2013.01)

(58) Field of Classification Search
CPC ............ G02F 2201/305; G02B 6/0058; G02B 6/0053
See application file for complete search history.

(56) References Cited

U.S. PATENT DOCUMENTS

| | | | |
|---|---|---|---|
| 8,179,034 B2 * | 5/2012 | Potts ..................... | B82Y 20/00 313/504 |
| 2009/0015757 A1 * | 1/2009 | Potts ..................... | B82Y 20/00 349/69 |

\* cited by examiner

*Primary Examiner* — Phu Vu
(74) *Attorney, Agent, or Firm* — Brooks Kushman P.C.

(57) ABSTRACT

A display panel, a fabrication method thereof and a display apparatus are provided. The display panel includes: a nanometer light splitting film arranged between an array substrate and a first polarizer. The nanometer light splitting film includes multiple light splitting units arranged in an array. Each light splitting unit corresponds to at least one sub-pixel unit. The light splitting unit includes a multi-step grating structure for splitting light corresponding to the at least one sub-pixel unit to obtain light of one or more predetermined colors.

20 Claims, 7 Drawing Sheets

DISPLAY PANEL, FABRICATION METHOD THEREOF AND DISPLAY APPARATUS

CROSS REFERENCE TO RELATED APPLICATION

This application claims a priority to Chinese patent application No. 201610566557.0, filed with the Chinese State Intellectual Property Office on Jul. 18, 2016, which is incorporated herein by reference in its entirety.

FIELD

The present disclosure relates to the field of liquid crystal display, and in particular, to a display panel, a fabrication method thereof and a display apparatus.

BACKGROUND

With the rapid development of display technology, more and more requirements are presented for the display apparatus. The display apparatus is being developed to be thinner, more convenient, more energy-saving, and to have finer screen, lower cost, and more functions. The stacked structure of a backlight module, a lower polarizer, an array substrate, a liquid crystal layer, a color filter substrate, and an upper polarizer in the display apparatus of related technology limits the thickness of the conventional liquid crystal display apparatus, and it is difficult to make the liquid crystal display apparatus thin. Additionally, at least 60% of the light energy is wasted by a color filter layer in the color filter substrate, and it is necessary to enhance the brightness of the backlight to meet the brightness requirement of the display apparatus, which results in increased power consumption.

Nano-grating spectroscopy enables a diffraction optical element to achieve color separation of the Fresnel diffraction field, by using interference and diffraction effects between nano-gratings. By selecting appropriate grating heights and phase distribution, three colors of red, green and blue can be separated efficiently in space. How to apply a nanometer light splitting element into a display apparatus and how to improve the color quality without substantially increasing cost are important issues in the field of liquid crystal display.

SUMMARY

In view of the shortcomings in the related technology, a display panel, a fabrication method thereof and a display apparatus are provided according to the present disclosure, so as to improve the color quality of the display apparatus without substantially increasing cost by applying a nanometer light splitting element into the display apparatus.

In a first aspect, a display panel is provided according to the present disclosure, which includes a nanometer light splitting film arranged at a side of an array substrate away from a liquid crystal layer, the nanometer light splitting film includes multiple light splitting units arranged in an array, and each of the light splitting units corresponds to at least one sub-pixel unit, the light splitting unit includes a multi-step grating structure for splitting light corresponding to the at least one sub-pixel unit to obtain light of one or more predetermined colors.

Optionally, the multi-step grating structure has a flat surface and a step surface, the light splitting unit further includes a filling layer matched with the multi-step grating structure, the filling layer has a flat surface and a step surface, and the step surface of the filling layer is attached to and matched with the step surface of the multi-step grating structure, and both a side of the nanometer light splitting film away from the array substrate and a side of the nanometer light splitting film facing toward the array substrate are flat.

Optionally, the multi-step grating structure includes multiple gratings with different heights.

Optionally, the nanometer light splitting film is arranged between the array substrate and a first polarizer,
the multi-step grating structure is attached to the array substrate, and the filling layer is attached to the first polarizer.

Optionally, the display panel further includes: a first substrate attached to the multi-step grating structure of the nanometer light splitting film.

Optionally, the nanometer light splitting film is arranged between the array substrate and a first polarizer,
the first substrate is attached to the first polarizer, and the filling layer is attached to the array substrate.

Optionally, the nanometer light splitting film is arranged between the array substrate and a first polarizer,
the first substrate is attached to the array substrate, and the filling layer is attached to the first polarizer.

Optionally, a first polarizer is arranged on the side of the array substrate away from the liquid crystal layer, the nanometer light splitting film is arranged on a side of the first polarizer away from the array substrate, and
the filling layer is attached to the first polarizer.

Optionally, a first polarizer is arranged on the array substrate at the side of the array substrate away from the liquid crystal layer, the nanometer light splitting film is arranged on a side of the first polarizer away from the array substrate, and
the first substrate is attached to the first polarizer.

Optionally, an absolute value of a difference between a refractive index of a material of the filling layer and a refractive index of a material of gratings in the multi-step grating structure is greater than 0.1, and the refractive index of the material of the gratings in the multi-step grating structure is in a range from 1.0 to 2.0, the refractive index of the material of the filling layer is in a range from 1.0 to 2.5, and the refractive index of the material of the gratings in the multi-step grating structure is greater than or less than the refractive index of the material of the filling layer.

Optionally, a transmittance of each pixel unit is determined by a grating period, a quantity of grating steps and grating heights of the multiple gratings in the multi-step grating structure, the grating period of the multiple gratings is in a range from 0.1 um to 300 um, the grating heights are in a range from 0.1 um to 30 um, and imaging heights are in a range from 2 um to 20 um.

In a second aspect, a fabrication method for a display panel is provided according to the present disclosure, which includes:

forming multiple gratings to form a nanometer light splitting film; and arranging the nanometer light splitting film at a side of an array substrate away from a liquid crystal layer, where the nanometer light splitting film includes multiple light splitting units arranged in an array, and each of the light splitting units corresponds to at least one sub-pixel unit, the light splitting unit includes a multi-step grating structure that is formed by the gratings and used to split light corresponding to the at least one sub-pixel unit to obtain light of one or more predetermined colors.

Optionally, each light splitting unit of the nanometer light splitting film further includes a filling layer, and after the fabricating multiple gratings, the fabrication method further includes:

forming the filling layer matched with the multi-step grating structure, where the filling layer has a flat surface and a step surface, the multi-step grating structure has a flat surface and a step surface, the step surface of the filling layer is attached to and matched with the step surface of the multi-step grating structure, and both a side of the nanometer light splitting film away from the array substrate and a side of the nanometer light splitting film facing toward the array substrate are flat.

Optionally, the step of forming the plurality of gratings to form the nanometer light splitting film includes:

forming the multiple gratings on the array substrate;

the step of arranging the nanometer light splitting film at the side of the array substrate away from the liquid crystal layer includes:

attaching a side of the nanometer light splitting film where the filling layer is formed onto a first polarizer.

Optionally, the step of forming the multiple gratings to form the nanometer light splitting film includes:

forming the multiple gratings on a first substrate.

Optionally, the step of arranging the nanometer light splitting film at the side of the array substrate away from the liquid crystal layer includes:

attaching a side of the nanometer light splitting film where the filling layer is formed onto the array substrate, and attaching the first substrate onto a first polarizer.

Optionally, the step of arranging the nanometer light splitting film at the side of the array substrate away from the liquid crystal layer includes:

attaching a side of the nanometer light splitting film where the filling layer is formed onto a first polarizer, and attaching the first substrate onto the array substrate.

Optionally, the step of arranging the nanometer light splitting film at the side of the array substrate away from the liquid crystal layer includes:

attaching a side of the nanometer light splitting film where the filling layer is formed onto a first polarizer, and attaching the first polarizer onto the array substrate.

Optionally, the step of arranging the nanometer light splitting film at the side of the array substrate away from the liquid crystal layer includes:

attaching the first substrate onto a first polarizer, and attaching the first polarizer onto the array substrate.

In a third aspect, a display apparatus is provided according to the present disclosure, which includes: a backlight module and any one of the above-described display panels arranged on a light outgoing side of the backlight module.

As can be seen from the above-described technical solution, for the display panel, the fabrication method thereof and the display apparatus according to the present disclosure, the nanometer light splitting film is formed between an array substrate and the first polarizer, that is, a nanometer grating is arranged on a cell, thus the imaging distance of the nanometer grating can be reduced and the effect of nanometer light splitting can be enhanced, thereby causing much more selection of grating structure parameters. Moreover, the realizability of applying a nanometer light splitting element into a display can be increased. Meanwhile, the nanometer light splitting film includes multiple light splitting units, and each of the light splitting units corresponds to at least one sub-pixel unit, the light splitting unit includes a multi-step grating structure for splitting light corresponding to the at least one sub-pixel unit to obtain light of one or more predetermined colors. Ideally, a color filter layer of a liquid crystal display apparatus can be omitted, that is, no color filter layer is included in a color filter substrate, thereby increasing the transmittance of the liquid crystal display apparatus by 300% and greatly increasing the displayed color gamut. Thus, in the embodiments of the present disclosure, a nanometer light splitting element is applied into a display apparatus, thereby improving the color quality of the display apparatus without substantially increasing cost.

BRIEF DESCRIPTION OF THE DRAWINGS

In order to explain the technical solutions in embodiments of the present disclosure or the conventional technology more clearly, accompanying drawings of the embodiments or the conventional technology are briefly illustrated hereinafter. Apparently, the accompanying drawings described hereinafter are only some embodiments of the present disclosure, and those skilled in the art can further conceive other drawings according to the drawings without creative work.

Figure 1:
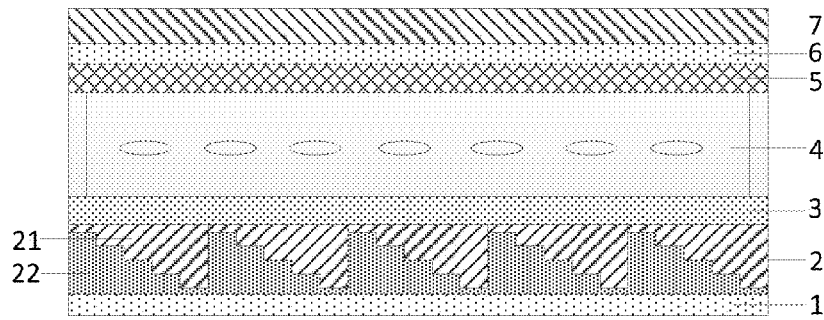
FIG. 1 is a schematic structural diagram of a display panel according to some embodiments of the present disclosure.

Description of reference numerals in FIG. 1 to FIG. 10, FIG. 17 and FIG. 18: 1—a first polarizer, 2—a nanometer light splitting film, 3—an array substrate, 4—a liquid crystal layer, 5—a second substrate, 6—a second polarizer, 7—a diffusion layer, 21—a multi-step grating structure, 22—a filling layer, 200—a grating, 100—a substrate, 110—a first attaching alignment mark.

DETAILED DESCRIPTION

Hereinafter, the technical solutions in embodiments of the present disclosure are described clearly and completely in conjunction with the drawings of the embodiments of the present disclosure. It is apparent that the described embodiments are only a part of embodiments of the present disclosure. Other embodiments obtained by those skilled in the art on the basis of the embodiments of the present disclosure without creative work fall into the scope of protection of the present disclosure.

Figure 2:
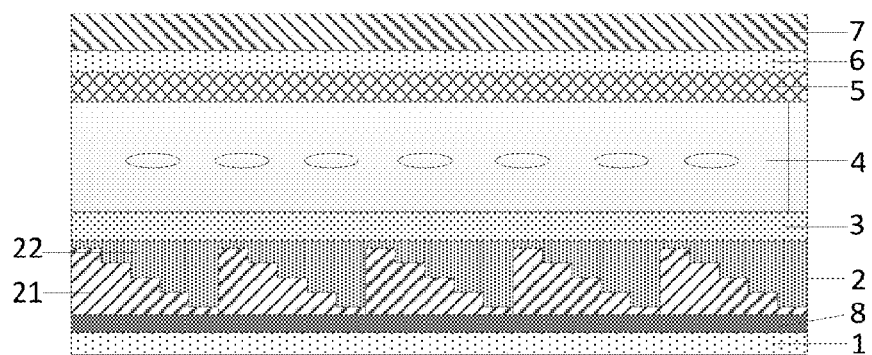
FIG. 2 is a schematic structural diagram of a display panel according to some embodiments of the present disclosure.

FIG. 1 and FIG. 2 are schematic structural diagrams of display panels according to some embodiments of the present disclosure. As shown in FIG. 1 and FIG. 2, a display panel includes a nanometer light splitting film 2 arranged on a side of an array substrate 3 away from a liquid crystal layer 4.

The nanometer light splitting film 2 includes multiple light splitting units arranged in an array, and each of the light splitting units corresponds to at least one sub-pixel unit. The light splitting unit includes a multi-step grating structure 21 for splitting light corresponding to the at least one sub-pixel unit to obtain light of one or more predetermined colors.

It follows that, in the embodiment of the present disclosure, the nanometer light splitting film is formed between an array substrate 3 and a first polarizer 1, that is, a nanometer grating is arranged on a cell, thus the imaging distance of the nanometer grating can be reduced and the effect of nanometer light splitting can be enhanced, thereby causing much more selection of grating structure parameters. Moreover, the realizability of applying a nanometer light splitting element into a display can be increased. Meanwhile, the nanometer light splitting film includes multiple light splitting units, and each of the light splitting units corresponds to at least one sub-pixel unit, the light splitting unit includes a multi-step grating structure for splitting light corresponding to the at least one sub-pixel unit to obtain light of one or more predetermined colors, so that the light of one or more predetermined colors is emitted into different sub-pixel units, such as a red sub-pixel unit, a blue sub-pixel unit, or a green sub-pixel unit. Ideally, a color filter layer of a liquid crystal display apparatus can be omitted, that is, no color filter layer is included in a color filter substrate, thereby increasing the transmittance of the liquid crystal display apparatus by 300% and greatly increasing the displayed color gamut. Thus, in the embodiments of the present disclosure, a nanometer light splitting element is applied into a display apparatus, thereby improving the color quality of the display apparatus without substantially increasing cost.

Further, in some optional embodiments of the present disclosure, the multi-step grating structure included in each of the light splitting units has a flat surface and a step surface, the light splitting unit further includes a filling layer matched with the multi-step grating structure, the filling layer has a flat surface and a step surface, and the step surface of the filling layer is attached to and matched with the step surface of the multi-step grating structure such that both a side of the nanometer light splitting film away from the array substrate and a side of the nanometer light splitting film facing toward the array substrate are flat.

For example, as shown in FIG. 1, a side of the multi-step grating structure 21 near the array substrate is a flat surface, a side of the multi-step grating structure 21 away from the array substrate is a step surface, the filling layer 22 is used to fill space between the multi-step grating structure 21 and the first polarizer 1, a side of the filling layer 22 near the first polarizer 1 is a flat surface, a side of the filling layer 22 away from the first polarizer 1 is a step surface, and the step surface of the filling layer 22 is closely attached to and matched with the step surface of the multi-step grating structure 21 to make both a side of the nanometer light splitting film 2 away from the array substrate 3 and a side of the nanometer light splitting film 2 facing toward the array substrate 3 be flat. As shown in FIG. 2, a side of the multi-step grating structure 21 away from the array substrate 3 is a flat surface, a side of the multi-step grating structure 21 near the array substrate 3 is a step surface, the filling layer 22 is used to fill space between the multi-step grating structure 21 and the array substrate 3, a side of the filling layer 22 away from the first polarizer 1 is a flat surface, a side of the filling layer 22 near the first polarizer 1 is a step surface, and the step surface of the filling layer 22 is closely attached to and matched with the step surface of the multi-step grating structure 21 to make both a side of the nanometer light splitting film 2 away from the array substrate 3 and a side of the nanometer light splitting film 2 facing toward the array substrate 3 be flat. Thus, the filling layer 22 and the multi-step grating structure 21 which are matched with each other can make both the side of the nanometer light splitting film 2 away from the array substrate 3 and the side of the nanometer light splitting film 2 facing toward the array substrate 3 be flat.

The multi-step grating structure 21 may include multiple gratings with different heights. The multiple gratings with different heights are used to split the light corresponding to the at least one sub-pixel unit to obtain light of one or more predetermined colors. For example, in a case that one light splitting unit corresponds to one sub-pixel unit and the sub-pixel unit needs to display in red, the multiple gratings of the light splitting unit splits light corresponding to the sub-pixel unit to obtain light of red which is then emitted into the sub-pixel unit.

Figure 6:
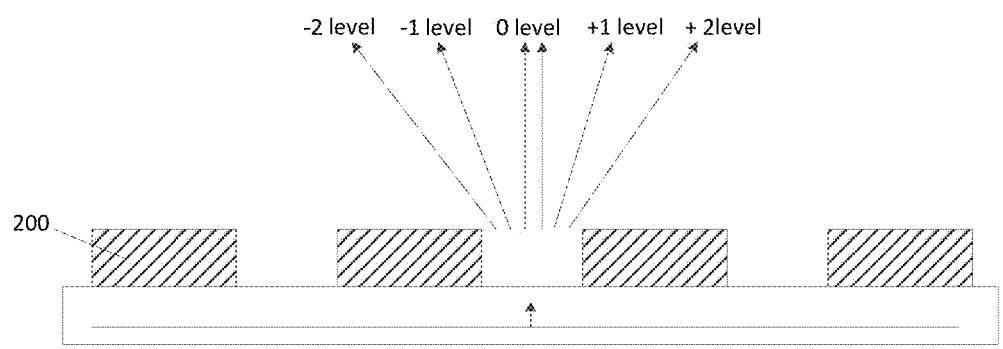
FIG. 6 is a schematic diagram of grating diffraction at various levels according to some embodiments of the present disclosure.
Figure 7:
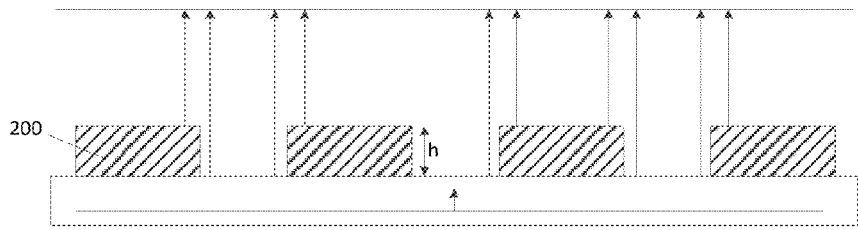
FIG. 7 is a schematic diagram of grating interference according to some embodiments of the present disclosure.

Specifically, as shown in FIG. 6 and FIG. 7, FIG. 6 is a schematic diagram of diffraction at various levels of a grating 200, and FIG. 7 is a schematic diagram of grating interference, the light is emitted into air via the grating 200 in FIG. 6 and FIG. 7. Understandably, in a case of destructive interference: $h (n_{PMMA}-n_{Air})=m\lambda/2$, that is, in a case that $(n_{PMMA}-n_{Air})$ is equal to 0.5, $\lambda=h/m$; and when m=1, 3, 5 . . . , a transmission valley occurs in zero-order diffraction and a transmission peak occurs in first-order diffraction. In a case of constructive interference: $h (n_{PMMA}-n_{Air})=m\lambda$, that is, in a case that $(n_{PMMA}-n_{Air})$ is equal to 0.5, $\lambda=h/(2m)$; and when m=1, 2, 3, . . . , a transmission peak occurs in zero-order diffraction and a transmission valley occurs in first-order diffraction. Where h is a height of the grating 200, $n_{PMMA}$ is a refractive index of the grating 200, $n_{Air}$ is a refractive index of the air, $\lambda$ is a wavelength of the incident light, and m is a ratio of an optical path difference over a half wavelength. In this embodiment, generally m is selected to be 1, 3, 5, . . . , so that the transmission valley occurs in the zero-order diffraction, and the transmission peak occurs in the first-order diffraction. It can be seen that the intensities of the zero-order diffraction and the first-order diffraction can be adjusted by adjusting the height of each grating and by means of the interference of the lights emitted via the gratings with different heights.

In some embodiments, the multi-step grating structure in each of the light splitting units includes multiple gratings with different heights. The number of grating steps (the number of gratings) may be selected in a range from 1 to 1001 levels (i.e., there may be 1-1001 gratings); a grating period coincides with the size of the at least one sub-pixel unit of the liquid crystal display apparatus corresponding to the light splitting unit. For example, if each of the light splitting units corresponds to three sub-pixel units, i.e., one pixel unit, the grating period, i.e., a period of each grating with one corresponding height in the light splitting unit, coincides with the size of one pixel unit.

Figure 8:
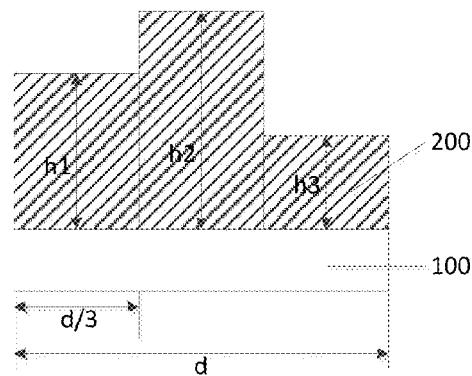
FIG. 8 is a schematic structural diagram of three gratings according to some embodiments of the present disclosure.
Figure 9:
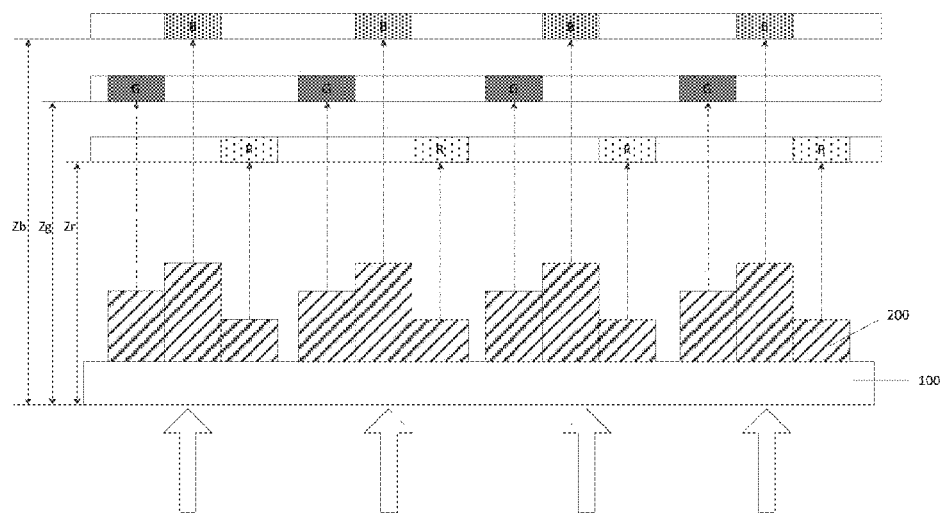
FIG. 9 is a schematic diagram of light splitting with three gratings according to some embodiments of the present disclosure.
Figure 10:
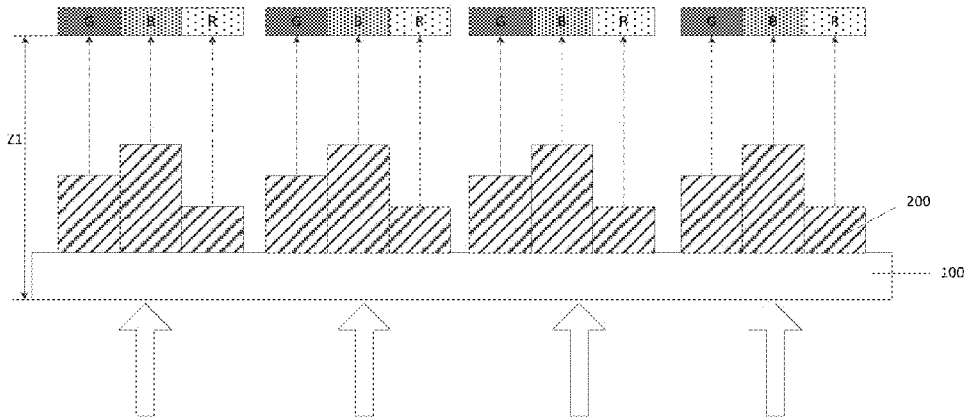
FIG. 10 is a schematic diagram of display effect of light splitting with three gratings according to some embodiments of the present disclosure.

For example, as shown in FIG. 8, taking a case that each of the light splitting units includes three gratings as an example, the heights of the three gratings are h1, h2, h3 respectively, the width of each grating is d/3, and then the total width of the three gratings is d. The gratings 200 are arranged on the substrate 100, and the substrate 100 is an array substrate or a first substrate. Further, in a schematic diagram of light splitting using three gratings as shown in FIG. 9, each pixel unit corresponds to one light splitting unit, and each light splitting unit includes three gratings, and lights of different colors are obtained by using gratings of different heights for light splitting. In a diagram of display effect of light splitting using three gratings as shown in FIG. 10, the three gratings corresponding to each light splitting unit may be used to perform light splitting to obtain lights of three colors of red (R), green (G) and blue (B), which correspond to three sub-pixel units of one pixel unit respectively.

Zr, Zg, and Zb in FIG. 9 are Taber imaging heights of the three gratings 200 of different heights, respectively, $$Z = \frac{\lambda}{1 - \sqrt{1 - \frac{\lambda^2}{d^2}}} \quad (1)$$

where Z is the Taber imaging height, $\lambda$ is the wavelength of the incident light, d is the grating period (i.e., the total width of the three gratings). It can be seen that Z is related to the wavelength of the incident light and the grating period.

According to the formula (1), in a case that the wavelength $\lambda$ of the incident light is determined, the imaging height Z is only related to the grating period d, and different imaging heights can be obtained by setting different grating periods within an allowable range for diffraction effect. The grating period is in a range from 0.1 um to 300 um, a grating height is in a range from 0.1 um to 30 um, and an imaging height is in a range from 2 um to 20 um.

Preferably, the grating height is in a range from 0.1 um to 5 um.

Further, a transmittance is calculated according to the following formula.

$$Tr = \left[ rect\left(\frac{x_0 + d/3}{d/3}\right) * \exp(i\phi_1) + rect\left(\frac{3x_0}{d}\right) * \exp(i\phi_2) + \right. \quad (2)$$

-continued
$$\left. rect\left(\frac{x_0 - d/3}{d/3}\right) * \exp(i\phi_3) \right] * \frac{1}{d} comb\left(\frac{x_0}{d}\right)$$

where $\phi_i = 2\pi(n-n_r)h_i/\lambda$, Tr is the transmittance, $x_0$ is a coordinate of a middle grating among the three gratings, $\phi_i$ is a phase delay corresponding to each grating, $h_i$ is the height of each grating, where i=1, 2, 3, n is a refractive index of the material of the gratings, and $n_r$ is a refractive index of the material of the filling layer. In the embodiment, the light is emitted from the grating into air, the air is regarded as the filling material, $n_r$ is equal to 1 which is the refractive index of the air, and n-1 represents a difference between the refractive indexes of the grating material and the air.

The material of the filling layer should be selected to have high transparency, and the transmittance of the material is greater than 80%. The absolute value of a difference between the refractive index of the material of the filling layer and the refractive index of the material of the gratings in the multi-step grating structure is greater than 0.1, and the absolute value of the difference is preferred to be as great as possible.

Preferably, the refractive index of the material of the gratings in the multi-step grating structure is in a range from 1.0 to 2.0, the refractive index of the material of the filling layer is in a range from 1.0 to 2.5, and the refractive index of the material of the gratings in the multi-step grating structure is greater than or less than the refractive index of the material of the filling layer.

According to the formula (2), the grating period, the number of the grating steps and the grating heights of multiple gratings in the multi-step grating structure are used to control the transmittance of each pixel unit. After the grating period d is fixed, the transmittance of each pixel unit can be controlled according to the number of grating steps and the grating heights.

In an optional embodiment of the present disclosure, as shown in FIG. 1, in the display panel according to the embodiment, the nanometer light splitting film 2 is arranged between the array substrate 3 and a first polarizer 1. The multi-step grating structure 21 is attached to the array substrate 3, and the filling layer 22 is attached to the first polarizer 1.

Additionally, the display panel according to some embodiments of the present disclosure further includes: a liquid crystal layer 4, a second substrate 5, a second polarizer 6 and a diffusion layer 7 successively arranged on a side of the array substrate 3 away from the nanometer light splitting film 2.

It should be noted that no color filter is included in the second substrate 5, and only a black matrix BM is needed to be arranged to shield metal electrodes in the array substrate 3.

Specifically, as shown in FIG. 1, in fabricating the display panel, after a cell process is finished, the multi-step grating structure 21 is formed on the side of the array substrate 3 away from the liquid crystal layer 4, the filling layer 22 is formed by using a material which has a refractive index difference from the material of the gratings to cover the step structure of the gratings, and finally the first polarizer 1 is attached onto a side of the filling layer 22 away from the array substrate 3.

In some optional embodiments of the present disclosure, the display panel further includes: a first substrate attached to the multi-step grating structure of the nanometer light splitting film.

Further, in some optional embodiments of the present disclosure, as shown in FIG. 2, the display panel according to the embodiments further includes: a first substrate 8 attached to the multi-step grating structure 21 of the nanometer light splitting film 2. The nanometer light splitting film 2 is arranged between the array substrate 3 and the first polarizer 1, the first substrate 8 is attached to the first polarizer 1, and the filling layer 22 is attached to the array substrate 3. Additionally, the display panel according to the embodiments further includes: a liquid crystal layer 4, a second substrate 5, a second polarizer 6 and a diffusion layer 7 successively arranged on a side of the array substrate 3 away from the nanometer light splitting film 2.

Specifically, in fabricating the display panel, a nanoimprint process may be performed on a material layer located on the first substrate 8 to form the multi-step grating structure 21, after the multi-step grating structure 21 is formed on the first substrate 8, a material which has a refractive index difference from the material of the multi-step grating structure 21 is utilized to cover the step structure of the gratings to form the filling layer 22, then the filling layer 22 is attached onto the array substrate 3 of the display panel, and finally the first polarizer 1 is attached onto a side of the first substrate 8 away from the array substrate 3.

Figure 3:
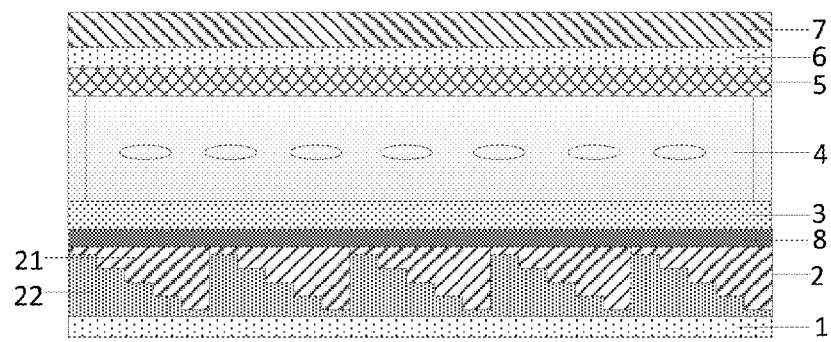
FIG. 3 is a schematic structural diagram of a display panel according to some embodiments of the present disclosure.

Further, in some optional embodiments of the present disclosure, as shown in FIG. 3, the display panel according to the embodiments further includes: a first substrate 8 attached to the multi-step grating structure 21 of the nanometer light splitting film 2. The nanometer light splitting film 2 is arranged between the array substrate 3 and the first polarizer 1, the first substrate 8 is attached to the array substrate 3, and the filling layer 22 is attached to the first polarizer 1.

Additionally, the display panel according to the embodiments further includes: a liquid crystal layer 4, a second substrate 5, a second polarizer 6 and a diffusion layer 7 successively arranged on a side of the array substrate 3 away from the nanometer light splitting film 2.

Specifically, in fabricating the display panel, a nanoimprint process may be performed on a material layer located on the first substrate 8 to form the multi-step grating structure 21, after the multi-step grating structure 21 is formed on the first substrate 8, a material which has a refractive index difference from the material of the multi-step grating structure 21 is utilized to cover the step structure of the gratings to form the filling layer 22, then the first substrate 8 is attached onto the array substrate 3 of the display panel, and finally the first polarizer 1 is attached onto a side of the filling layer 22 away from the array substrate 3.

Figure 4:
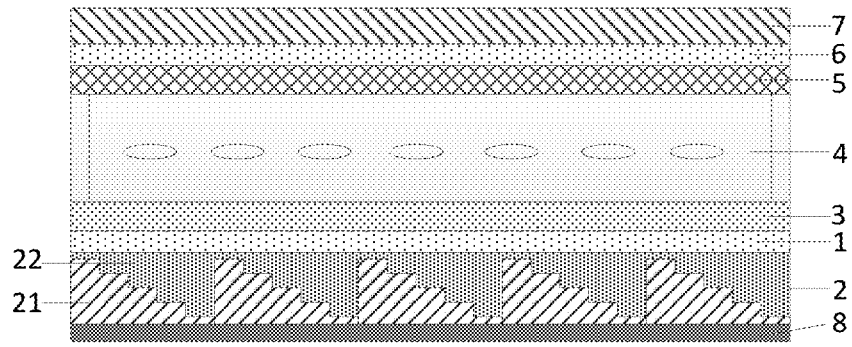
FIG. 4 is a schematic structural diagram of a display panel according to some embodiments of the present disclosure.

Further, in some optional embodiments of the present disclosure, as shown in FIG. 4, the display panel according to the embodiments further includes: a first substrate 8 attached to the multi-step grating structure 21 of the nanometer light splitting film 2. The first polarizer 1 is arranged on a side of the array substrate 3 away from the liquid crystal layer 4, the nanometer light splitting film 2 is arranged on a side of the first polarizer 1 away from the array substrate 3, and the filling layer 22 is attached to the first polarizer 1.

Additionally, the display panel according to the embodiments further includes: the liquid crystal layer 4, a second substrate 5, a second polarizer 6 and a diffusion layer 7 successively arranged on a side of the array substrate 3 away from the first polarizer 1.

Specifically, in fabricating the display panel, a nanoimprint process may be performed on a material layer located on the first substrate 8 to form the multi-step grating structure 21, after the multi-step grating structure 21 is formed on the first substrate 8, a material which has a refractive index difference from the material of the multi-step grating structure 21 is utilized to cover the step structure of the gratings to form the filling layer 22, and then the filling layer 22 is attached onto the first polarizer 1 of the display panel.

Figure 5:
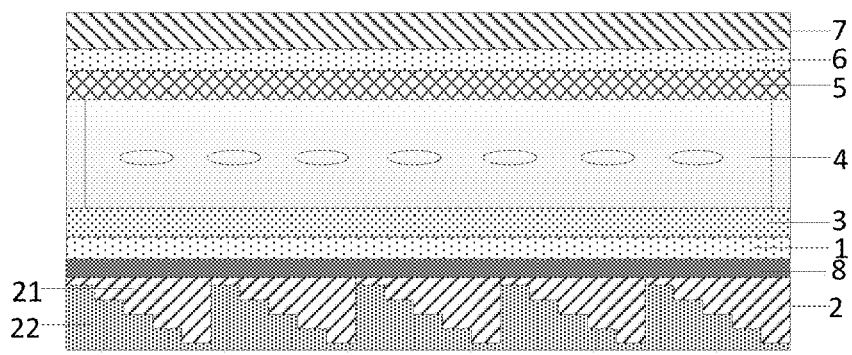
FIG. 5 is a schematic structural diagram of a display panel according to some embodiments of the present disclosure.

Further, in some optional embodiments of the present disclosure, as shown in FIG. 5, the display panel according to the embodiments further includes: a first substrate 8 attached to the multi-step grating structure 21 of the nanometer light splitting film 2. The first polarizer 1 is arranged on a side of the array substrate 3 away from the liquid crystal layer 4, the nanometer light splitting film 2 is arranged at a side of the first polarizer 1 away from the array substrate 3, and the first substrate 8 is attached to the first polarizer 1.

Additionally, the display panel according to the embodiments further includes: the liquid crystal layer 4, a second substrate 5, a second polarizer 6 and a diffusion layer 7 successively arranged on a side of the array substrate 3 away from the first polarizer 1.

Specifically, in fabricating the display panel, a nanoimprint process may be performed on a material layer located on the first substrate 8 to form the multi-step grating structure 21, after the multi-step grating structure 21 is formed on the first substrate 8, a material which has a refractive index difference from the material of the multi-step grating structure 21 is utilized to cover the step structure of the gratings to form the filling layer 22, and then the first substrate 8 is attached onto the first polarizer 1 of the display panel.

It should be noted that the display mode of the display panel applied in the above-described embodiments is not defined, which may be an In-Plane Switching (IPS) mode, a Twisted Nematic (TN) mode, or a Vertical Alignment (VA) mode.

Figure 11:
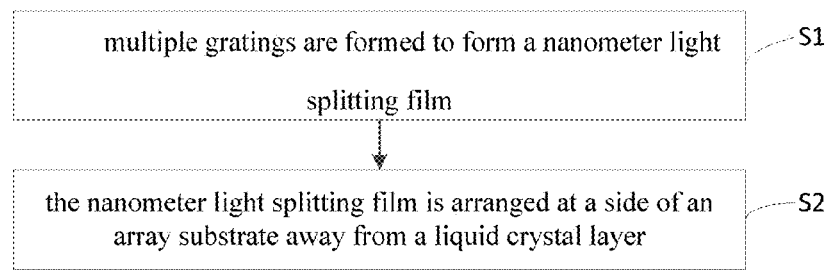
FIG. 11 is a flowchart of a fabrication method for a display panel according to some embodiments of the present disclosure.

FIG. 11 is a flowchart of a fabrication method for a display panel according to some embodiments of the present disclosure. As shown in FIG. 11, the fabrication method includes the following steps.

In step S1, multiple gratings are fabricated to form a nanometer light splitting film.

In step S2, the nanometer light splitting film is arranged at a side of an array substrate away from a liquid crystal layer.

The nanometer light splitting film includes multiple light splitting units arranged in an array, and each of the light splitting units corresponds to at least one sub-pixel unit, the light splitting unit includes a multi-step grating structure formed by gratings and is for splitting light corresponding to the at least one sub-pixel unit to obtain light of one or more predetermined colors.

It follows that, the nanometer light splitting film is formed between an array substrate and a first polarizer, that is, a nanometer grating is arranged on a cell, thus the imaging distance of the nanometer grating can be reduced and the effect of nanometer light splitting can be enhanced, thereby causing much more selection of grating structure parameters. Moreover, the realizability of applying a nanometer light splitting element into a display can be increased. Meanwhile, the nanometer light splitting film includes multiple light splitting units, and each of the light splitting units corresponds to at least one sub-pixel unit, the light splitting unit includes a multi-step grating structure for splitting light corresponding to the at least one sub-pixel unit to obtain light of one or more predetermined colors. Ideally, a color filter layer of a liquid crystal display apparatus can be omitted, that is, no color filter layer is included in a color filter substrate, thereby increasing the transmittance of the liquid crystal display apparatus by 300% and greatly increasing the displayed color gamut. Thus, in the embodiments of the present disclosure, a nanometer light splitting element is applied into a display apparatus, thereby improving the color quality of the display apparatus without substantially increasing cost.

The multi-step grating structure includes multiple gratings with different heights. The multiple gratings with different heights are used to split the light corresponding to the at least one sub-pixel unit to obtain light of one or more predetermined colors. For example, in a case that one light splitting unit corresponds to three sub-pixel units, the light splitting unit provides light of three colors of R, G or B for the three sub-pixel units respectively.

Specifically, the fabricating multiple gratings in step S1 includes:

fabricating multiple nano-gratings by means of a nanoimprint process, a laser direct writing process or an electron beam direct writing process.

In some optional embodiments of the present disclosure, each of the light splitting units of the nanometer light splitting film further includes a filling layer, after the fabricating multiple gratings in step S1, the method further includes the following step:

forming the filling layer matched with the multi-step grating structure, where the filling layer has a flat surface and a step surface, the multi-step grating structure has a flat surface and a step surface, and the step surface of the filling layer is attached to and matched with the step surface of the multi-step grating structure to make both a side of the nanometer light splitting film away from the array substrate and a side of the nanometer light splitting film facing toward the array substrate be flat.

Figure 12:
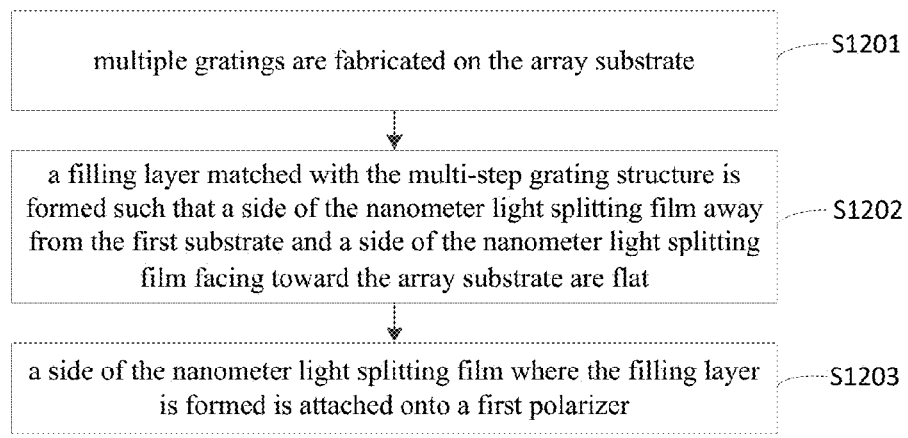
FIG. 12 is a flowchart of a fabrication method for a display panel according to some embodiments of the present disclosure.

In some optional embodiments of the present disclosure, as shown in FIG. 12, a fabrication method for a display panel according to the embodiment includes the following steps.

In step 1201, multiple gratings are fabricated on the array substrate.

Understandably, the above-described step S1 is implemented by step S1201 in the embodiments.

Specifically, after a cell process is finished, that is, as shown in FIG. 1, after a liquid crystal layer 4, a second substrate 5, a second polarizer 6 and a diffusion layer 7 are successively arranged on a side of the array substrate 3, a multi-step grating structure is formed on the side of the array substrate 3 away from the liquid crystal layer 4.

In step 1202, a filling layer matched with the multi-step grating structure is formed. The filling layer has a flat surface and a step surface, the multi-step grating structure has a flat surface and a step surface, the step surface of the filling layer is attached to and matched with the step surface of the multi-step grating structure, a nanometer light splitting film is formed by the multi-step grating structure and the filling layer, and both a side of the nanometer light splitting film away from the array substrate and a side of the nanometer light splitting film facing toward the array substrate are flat.

In step 1203, a side of the nanometer light splitting film where the filling layer is formed is attached onto a first polarizer.

Understandably, the above-described step S2 is implemented by step S1203 in the embodiments.

Specifically, the display panel formed by steps S1201 to S1203 is shown in FIG. 1.

Figure 13:
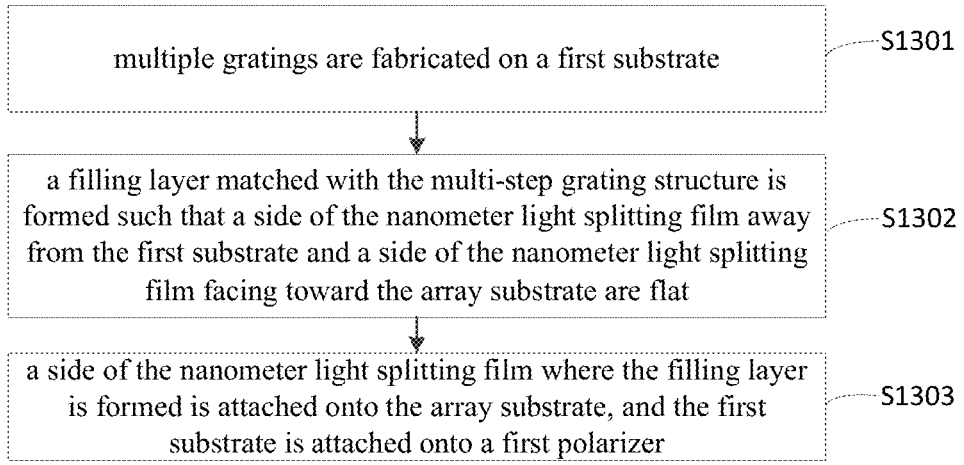
FIG. 13 is a flowchart of a fabrication method for a display panel according to some embodiments of the present disclosure.

In some optional embodiments of the present disclosure, as shown in FIG. 13, a fabrication method for a display panel according to the embodiments includes the following steps.

In step 1301, multiple gratings are fabricated on a first substrate.

Understandably, the above-described step S1 is implemented by step S1301 in the embodiments.

Specifically, in fabricating the display panel according to the embodiments, a multi-step grating structure may be formed by performing a nanoimprint process on a material layer located on the first substrate.

In step 1302, a filling layer matched with the multi-step grating structure is formed. The filling layer has a flat surface and a step surface, the multi-step grating structure has a flat surface and a step surface, the step surface of the filling layer is attached to and matched with the step surface of the multi-step grating structure, a nanometer light splitting film is formed by the multi-step grating structure and the filling layer, and both a side of the nanometer light splitting film away from the first substrate and a side of the nanometer light splitting film facing toward the array substrate are flat.

In step 1303, a side of the nanometer light splitting film where the filling layer is formed is attached onto the array substrate, and the first substrate is attached onto a first polarizer.

Understandably, the above-described step S2 is implemented by step S1303 in the embodiments.

Specifically, the display panel formed by steps S1301 to S1303 is shown in FIG. 2.

Figure 14:
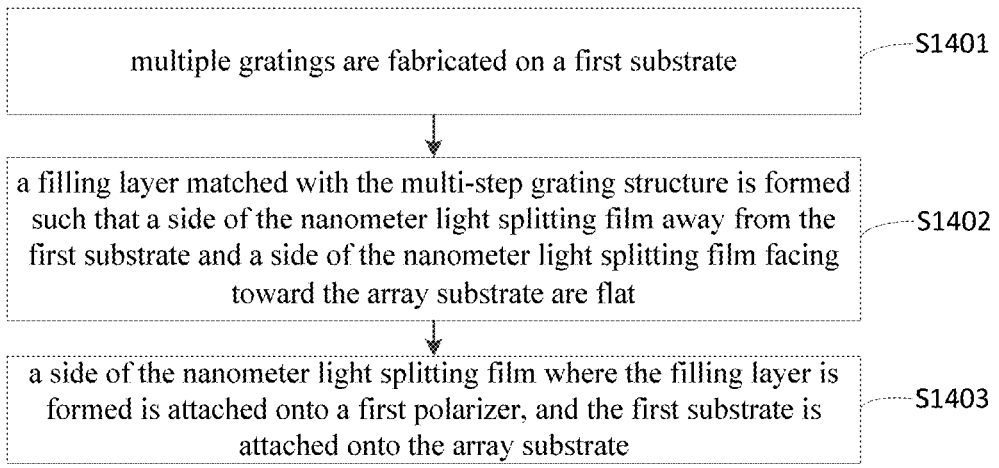
FIG. 14 is a flowchart of a fabrication method for a display panel according to some embodiments of the present disclosure.

In some optional embodiments of the present disclosure, as shown in FIG. 14, a fabrication method for a display panel according to the embodiment includes the following steps.

In step 1401, multiple gratings are fabricated on a first substrate.

Understandably, the above-described step S1 is implemented by step S1401 in the embodiments.

Specifically, in fabricating the display panel according to the embodiments, a multi-step grating structure may be formed by performing a nanoimprint process on a material layer located on the first substrate.

In step 1402, a filling layer matched with the multi-step grating structure is formed. The filling layer has a flat surface and a step surface, the multi-step grating structure has a flat surface and a step surface, the step surface of the filling layer is attached to and matched with the step surface of the multi-step grating structure, a nanometer light splitting film is formed by the multi-step grating structure and the filling layer, and both a side of the nanometer light splitting film away from the first substrate and a side of the nanometer light splitting film facing toward the array substrate are flat.

In step 1403, a side of the nanometer light splitting film where the filling layer is formed is attached onto a first polarizer, and the first substrate is attached onto the array substrate.

Understandably, the above-described step S2 is implemented by step S1403 in the embodiments.

Specifically, the display panel formed by steps S1401 to S1403 is shown in FIG. 3.

Figure 15:
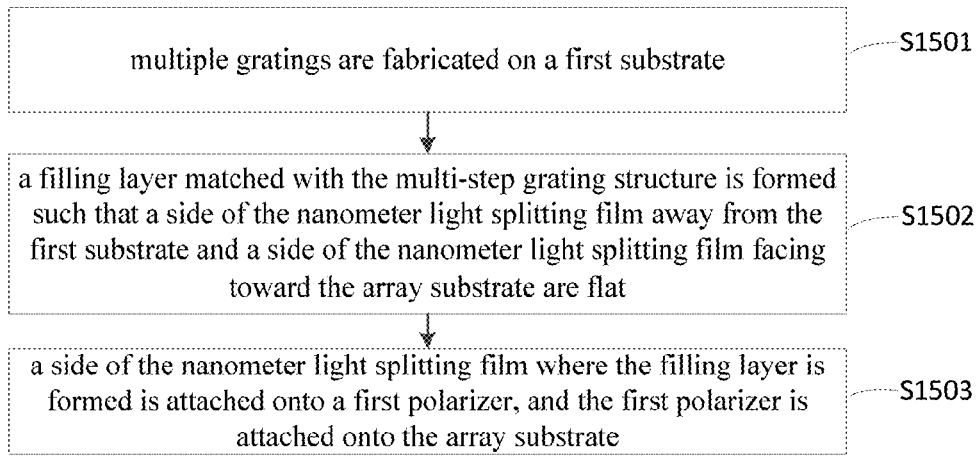
FIG. 15 is a flowchart of a fabrication method for a display panel according to some embodiments of the present disclosure.

In some optional embodiments of the present disclosure, as shown in FIG. 15, a fabrication method for a display panel according to the embodiments includes the following steps.

In step 1501, multiple gratings are fabricated on a first substrate.

Understandably, the above-described step S1 is implemented by step S1501 in the embodiments.

Specifically, in fabricating the display panel according to the embodiments, a multi-step grating structure may be formed by performing a nanoimprint process on a material layer located on the first substrate.

In step 1502, a filling layer matched with the multi-step grating structure is formed. The filling layer has a flat surface and a step surface, the multi-step grating structure has a flat surface and a step surface, the step surface of the filling layer is attached to and matched with the step surface of the multi-step grating structure, a nanometer light splitting film is formed by the multi-step grating structure and the filling layer, and both a side of the nanometer light splitting film away from the first substrate and a side of the nanometer light splitting film facing toward the array substrate are flat.

In step 1503, a side of the nanometer light splitting film where the filling layer is formed is attached onto a first polarizer, and the first polarizer is attached onto the array substrate.

Understandably, the above-described step S2 is implemented by step S1503 in the embodiments.

Specifically, the display panel formed by steps S1501 to S1503 is shown in FIG. 4.

Figure 16:
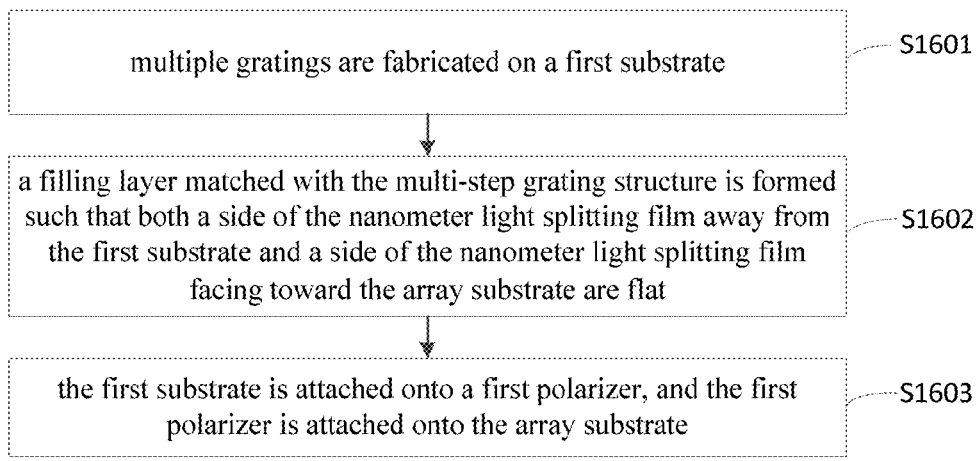
FIG. 16 is a flowchart of a fabrication method for a display panel according to some embodiments of the present disclosure.

In some optional embodiments of the present disclosure, as shown in FIG. 16, a fabrication method for a display panel according to the embodiment includes the following steps.

In step 1601, multiple gratings are fabricated on a first substrate.

Understandably, the above-described step S1 is implemented by step S1601 in the embodiments.

Specifically, in fabricating the display panel according to the embodiments, a multi-step grating structure may be formed by performing a nanoimprint process on a material layer located on the first substrate.

In step 1602, a filling layer matched with the multi-step grating structure is formed. The filling layer has a flat surface and a step surface, the multi-step grating structure has a flat surface and a step surface, the step surface of the filling layer is attached to and matched with the step surface of the multi-step grating structure, a nanometer light splitting film is formed by the multi-step grating structure and the filling layer, and both a side of the nanometer light splitting film away from the first substrate and a side of the nanometer light splitting film facing toward the array substrate are flat.

In step 1603, the first substrate is attached onto a first polarizer, and the first polarizer is attached onto the array substrate.

Understandably, the above-described step S2 is implemented by step S1603 in the embodiments.

Specifically, the display panel formed by steps S1601 to S1603 is shown in FIG. 5.

Further, in some embodiments of the present disclosure, a fabrication method for a display panel further includes the following steps.

In step A01, multiple first attaching alignment marks are formed in a PAD region of an array substrate, when forming thin film transistors (TFTs) of the array substrate.

Figure 17:
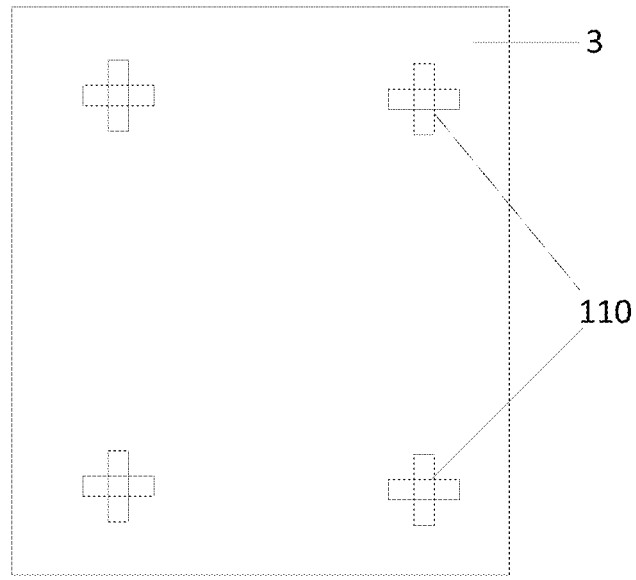
FIG. 17 is a schematic diagram of positions of first attaching alignment marks on an array substrate according to some embodiments of the present disclosure.

For example, as shown in FIG. 17, in the TFT process, multiple first attaching alignment marks may be formed in the PAD region of the array substrate (four first attaching alignment marks are shown in FIG. 17), when forming a gate metal layer or a source-drain metal layer.

Figure 18:
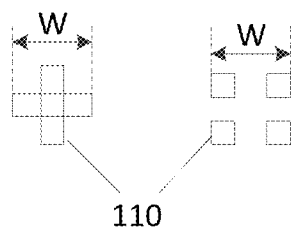
FIG. 18 is a schematic diagram of shapes of a first attaching alignment mark according to some embodiments of the present disclosure.

An optional shape of the first attaching alignment mark 110 is shown in FIG. 18, and W is the width of the first attaching alignment mark 110. Of course, the first attaching alignment mark may also have other shapes, which are not limited in the present disclosure.

In step A02, multiple second attaching alignment marks corresponding to the first attaching alignment marks are formed on a first substrate, when forming multiple gratings on the first substrate.

Specifically, when forming the multiple gratings on the first substrate, the second attaching alignment marks may be formed on the first substrate by means of the nanoimprint process according to sizes and locations of the first attaching alignment marks on the array substrate.

In step A03, the array substrate is aligned to and attached onto the first substrate based on the first attaching alignment marks and the second attaching alignment marks.

Specifically, the array substrate is high precisely aligned to and attached onto the first substrate based on the alignment marks, such that the nanometer light splitting film on the first substrate is attached to the array substrate.

Based on the same concept, a display apparatus is provided according to an embodiment of the present disclosure, which includes: a backlight module and any one of the above-described display panels arranged on a light outgoing side of the backlight module. The display apparatus may be any product or component having a display function, such as a liquid crystal display, a mobile phone, a tablet computer, a television set, a notebook computer, a digital photo frame, or a navigator. Since the display apparatus includes any one of the above-described display panels, the same technical problem can be solved and the same technical effects can be obtained.

It should be noted that the backlight module in the embodiment may be a direct-emitting backlight module, or may also be an edge-emitting backlight module, which is not limited in the embodiment.

In the description of the present disclosure, it should be noted that, the location or position relationship represented by the terms "on/above" and "under/below" is location or position relationships shown in drawings, is just for ease of describing the present disclosure and simplifying the description, rather than indicating or implying that the apparatus or element must have a specific orientation, be constructed and operated in a specific orientation, which should not be construed as limiting the present disclosure. Unless otherwise expressly defined and limited, the terms "install", "connect" or "connected to" should be understood broadly, for example, may be a fixed connection, a detachable connection, or an integrated connection, may be a mechanical connection, may be an electrical connection, may be a direct connection, may be an indirect connection through an intermediary, or may also be a connection inside two elements. The specific connotations of the above-mentioned terms in the present disclosure may be understood by those ordinary skilled in the art according to the practical situations.

It should be noted that, in the present disclosure, relational terms such as "first" and "second" are used only to distinguish one entity or operation from the other entity or operation, but not necessarily demand or imply that there is actual relation or order among those entities and operations. Furthermore, the terms "including", "containing", or any other variations thereof means a non-exclusive inclusion, so that the process, method, article or device that includes a series of elements includes not only these elements but also other elements that are not explicitly listed, or further includes elements inherent in the process, method, article or device. Moreover, when there is no further limitation, the element defined by the wording "include(s) a . . . " does not exclude the case that in the process, method, article or device that includes the element there are other same elements.

The above-mentioned embodiments are only used to illustrate the technical solutions of the present disclosure, but not to limit it. Although the present disclosure have been described in detail according to the above-mentioned embodiments, it should be understood to those skilled in the art that the various modifications and equivalent substitutions may be made to the technical solutions recorded in the above-mentioned embodiments, and those modifications and equivalent substitutions do not make the relevant technical solutions departing from the scope of the present disclosure.

The invention claimed is:

1. A display panel, comprising:
a nanometer light splitting film arranged at a side of an array substrate away from a liquid crystal layer,
wherein the nanometer light splitting film comprises a plurality of light splitting units arranged in an array, and each light splitting unit corresponds to at least one sub-pixel unit, the light splitting unit comprises a multi-step grating structure configured to split light corresponding to the at least one sub-pixel unit to obtain light of one or more predetermined colors.

2. The display panel according to claim 1, wherein the multi-step grating structure has a flat surface and a step surface, the light splitting unit further comprises a filling layer matched with the multi-step grating structure, the filling layer has a flat surface and a step surface, and the step surface of the filling layer is attached to and matched with the step surface of the multi-step grating structure, wherein both a side of the nanometer light splitting film away from the array substrate and a side of the nanometer light splitting film facing toward the array substrate are flat.

3. The display panel according to claim 1, wherein the multi-step grating structure comprises a plurality of gratings having different heights.

4. The display panel according to claim 2, wherein the nanometer light splitting film is arranged between the array substrate and a first polarizer, the multi-step grating structure is attached to the array substrate, and the filling layer is attached to the first polarizer.

5. The display panel according to claim 2, further comprising: a first substrate attached to the multi-step grating structure of the nanometer light splitting film.

6. The display panel according to claim 5, wherein the nanometer light splitting film is arranged between the array substrate and a first polarizer, the first substrate is attached to the first polarizer, and the filling layer is attached to the array substrate.

7. The display panel according to claim 5, wherein the nanometer light splitting film is arranged between the array substrate and a first polarizer, the first substrate is attached to the array substrate, and the filling layer is attached to the first polarizer.

8. The display panel according to claim 5, wherein a first polarizer is arranged on the array substrate at the side of the array substrate away from the liquid crystal layer, the nanometer light splitting film is arranged on a side of the first polarizer away from the array substrate, and the filling layer is attached to the first polarizer.

9. The display panel according to claim 5, wherein a first polarizer is arranged on the array substrate at the side of the array substrate away from the liquid crystal layer, the nanometer light splitting film is arranged at a side of the first polarizer away from the array substrate, and the first substrate is attached to the first polarizer.

10. The display panel according to claim 2, wherein an absolute value of a difference between a refractive index of a material of the filling layer and a refractive index of a material of gratings in the multi-step grating structure is greater than 0.1; and
the refractive index of the material of the gratings in the multi-step grating structure is in a range from 1.0 to 2.0, the refractive index of the material of the filling layer is in a range from 1.0 to 2.5, and the refractive index of the material of the gratings in the multi-step grating structure is greater than or less than the refractive index of the material of the filling layer.

11. The display panel according to claim 3, wherein a transmittance of each pixel unit is determined by a grating period, a quantity of grating steps and grating heights of the plurality of gratings in the multi-step grating structure, wherein the grating period is in a range from 0.1 um to 300 um, the grating heights are in a range from 0.1 um to 30 um, and imaging heights are in a range from 2 um to 20 um.

12. A fabrication method for a display panel, comprising:
forming a plurality of gratings to form a nanometer light splitting film; and
arranging the nanometer light splitting film at a side of an array substrate away from a liquid crystal layer,
wherein the nanometer light splitting film comprises a plurality of light splitting units arranged in an array, each light splitting unit corresponds to at least one sub-pixel unit, and the light splitting unit comprises a multi-step grating structure that is formed by the gratings and configured to split light corresponding to the at least one sub-pixel unit to obtain light of one or more predetermined colors.

13. The fabrication method according to claim 12, wherein each light splitting unit of the nanometer light splitting film further comprises a filling layer, and after the step of forming the plurality of gratings, the fabrication method further comprises:
forming the filling layer matched with the multi-step grating structure, wherein the filling layer has a flat surface and a step surface, the multi-step grating structure has a flat surface and a step surface, and the step surface of the filling layer is attached to and matched with the step surface of the multi-step grating structure, and both a side of the nanometer light splitting film away from the array substrate and a side of the nanometer light splitting film facing toward the array substrate are flat.

14. The fabrication method according to claim 13, wherein the step of forming the plurality of gratings to form the nanometer light splitting film comprises:
forming the plurality of gratings on the array substrate; and
wherein the step of arranging the nanometer light splitting film at the side of the array substrate away from the liquid crystal layer comprises:
attaching a side of the nanometer light splitting film where the filling layer is formed onto a first polarizer.

15. The fabrication method according to claim 13, wherein the step of forming the plurality of gratings to form the nanometer light splitting film comprises:
forming the plurality of gratings on a first substrate.

16. The fabrication method according to claim 15, wherein the step of arranging the nanometer light splitting film at the side of the array substrate away from the liquid crystal layer comprises:
attaching a side of the nanometer light splitting film where the filling layer is formed onto the array substrate, and attaching the first substrate onto a first polarizer.

17. The fabrication method according to claim 15, wherein the step of arranging the nanometer light splitting film at the side of the array substrate away from the liquid crystal layer comprises:

attaching a side of the nanometer light splitting film where the filling layer is formed onto a first polarizer, and attaching the first substrate onto the array substrate.

18. The fabrication method according to claim 15, wherein the step of arranging the nanometer light splitting film at the side of the array substrate away from the liquid crystal layer comprises:

attaching a side of the nanometer light splitting film where the filling layer is formed onto a first polarizer, and attaching the first polarizer onto the array substrate.

19. The fabrication method according to claim 15, wherein the step of arranging the nanometer light splitting film at the side of the array substrate away from the liquid crystal layer comprises:

attaching the first substrate onto a first polarizer, and attaching the first polarizer onto the array substrate.

20. A display apparatus, comprising: a backlight module and a display panel arranged on a light outgoing side of the backlight module;

wherein the display panel comprises a nanometer light splitting film arranged at a side of an array substrate away from a liquid crystal layer, the nanometer light splitting film comprises a plurality of light splitting units arranged in an array, each light splitting unit corresponds to at least one sub-pixel unit, and the light splitting unit comprises a multi-step grating structure configured to split light corresponding to the at least one sub-pixel unit to obtain light of one or more predetermined colors.

* * * * *